United States Patent
Huang et al.

(10) Patent No.: US 12,284,818 B2
(45) Date of Patent: Apr. 22, 2025

(54) HIGH-THRESHOLD-VOLTAGE NORMALLY-OFF HIGH-ELECTRON-MOBILITY TRANSISTOR AND PREPARATION METHOD THEREFOR

(71) Applicant: DALIAN UNIVERSITY OF TECHNOLOGY, Dalian (CN)

(72) Inventors: Huolin Huang, Dalian (CN); Zhonghao Sun, Dalian (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 621 days.

(21) Appl. No.: 17/594,636

(22) PCT Filed: Apr. 28, 2020

(86) PCT No.: PCT/CN2020/087347
§ 371 (c)(1),
(2) Date: Oct. 25, 2021

(87) PCT Pub. No.: WO2020/221222
PCT Pub. Date: Nov. 5, 2020

(65) Prior Publication Data
US 2022/0209000 A1  Jun. 30, 2022

(30) Foreign Application Priority Data
Apr. 30, 2019  (CN) .......................... 201910361958.6

(51) Int. Cl.
*H10D 30/47*    (2025.01)
*H01L 21/02*    (2006.01)
(Continued)

(52) U.S. Cl.
CPC ....... *H10D 30/475* (2025.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS

| | | |
|---|---|---|
| 2015/0028345 A1 | 1/2015 | Wong et al. |
| 2016/0141404 A1 | 5/2016 | Tsai et al. |
| 2018/0219089 A1* | 8/2018 | Nakayama .......... H01L 29/7787 |

FOREIGN PATENT DOCUMENTS

| | | |
|---|---|---|
| CN | 101897029 A | 11/2010 |
| CN | 102368501 A | 3/2012 |

(Continued)

OTHER PUBLICATIONS

Ambacher O. "Polarization Induced Effects in AlGaN/GaN Heterostructures" Acta Physica Polonica Series a 98(3) Sep. 2000 pp. 195-201 (Year: 2000).*

(Continued)

*Primary Examiner* — Grant S Withers
(74) *Attorney, Agent, or Firm* — HAUPTMAN HAM, LLP

(57) ABSTRACT

A high-threshold-voltage normally-off high-electron-mobility transistor (HEMT) includes a nucleation layer and an epitaxial layer are grown sequentially on a substrate; a barrier layer, a source, and a drain above the epitaxial layer; the barrier layer and the epitaxial layer form a heterojunction structure, and the contact interface therebetween is induced by polarization charges to generate two-dimensional electron gas. The HEMT includes a passivation layer above the barrier layer; a gate cap layer above the gate region barrier layer; the upper part of the gate cap layer is subjected to surface plasma oxidation to form an oxide dielectric layer, or a single-layer or multiple gate dielectric insertion layer is directly deposited thereon. The HEMT includes a gate is located above the gate dielectric insertion layer; the gate is in contact with the passivation layer; and a field plate extends from the gate to the drain on the passivation layer.

4 Claims, 4 Drawing Sheets

(51) Int. Cl.
- *H01L 21/285* (2006.01)
- *H01L 21/306* (2006.01)
- *H01L 21/76* (2006.01)
- *H01L 21/765* (2006.01)
- *H10D 30/01* (2025.01)
- *H10D 62/824* (2025.01)
- *H10D 62/85* (2025.01)
- *H10D 64/00* (2025.01)

(52) U.S. Cl.
CPC ............ *H01L 21/28575* (2013.01); *H01L 21/30621* (2013.01); *H01L 21/7605* (2013.01); *H01L 21/765* (2013.01); *H10D 30/015* (2025.01); *H10D 62/824* (2025.01); *H10D 62/8503* (2025.01); *H10D 64/111* (2025.01)

(56) References Cited

FOREIGN PATENT DOCUMENTS

| | | | |
|---|---|---|---|
| CN | 103227198 | A | 7/2013 |
| CN | 103904111 | A | 7/2014 |
| CN | 105895526 | A | 8/2016 |
| CN | 106373884 | A | 2/2017 |
| CN | 107369704 | A | 11/2017 |
| CN | 108155099 | A | 6/2018 |
| CN | 109314136 | A | 2/2019 |
| CN | 110112215 | A | 8/2019 |
| CN | 110190116 | A | 8/2019 |
| IN | 109244130 | A | 1/2019 |

OTHER PUBLICATIONS

Notice of First Review Opinion issued in Chinese Application No. 201910361958.6; mailed May 20, 2020; 14 pgs.
Search Report issued in Chinese Application No. 201910361958.6; mailed May 11, 2020; 6 pgs.
Notice of the Third Review Opinion issued in Chinese Application No. 201910361958.6; mailed Mar. 26, 2021; 10 pgs.
Search Report issued in Chinese Application No. 201910361958.6; mailed Mar. 18, 2021; 4 pgs.
International Search Report issued in PCT/CN2020/087347; mailed Jul. 29, 2020; 8 pgs.
Mohanbabu A, et al.; Recessed Mg-doped P-type In0.2Ga0.8N cap Gate AlGaN/GaN/AlGaN DH-HEMT for high breakdown and power electronics applications; 2016 International Conference on Inventive Computation Technologies (ICICT); Jul. 19, 2017; 4 pgs.

* cited by examiner

HIGH-THRESHOLD-VOLTAGE NORMALLY-OFF HIGH-ELECTRON-MOBILITY TRANSISTOR AND PREPARATION METHOD THEREFOR

RELATED APPLICATIONS

The present application is a U.S. National Phase of International Application Number PCT/CN2020/087347 filed Apr. 28, 2020 and claims priority to Chinese Application Number 201910361958.6 filed Apr. 30, 2019.

TECHNICAL FIELD

The present invention relates to the technical field of semiconductor devices, and in particular relates to a high-threshold-voltage normally-off high-electron-mobility transistor and a preparation method therefor.

BACKGROUND

Following first-generation semiconductor materials (Ge, Si, etc.) and second-generation compound semiconductor materials (GaAs, InP, etc.), gallium nitride (GaN), as an important representative of novel third-generation wide band gap semiconductor materials, has developed rapidly, and has become the frontier and hot spot of research in the field of power semiconductors. GaN-based (mainly GaN, and including GaN, AlN, InN, and component combinations thereof, etc.) semiconductor materials have excellent characteristics such as large band gap, high electron saturation velocity, high-temperature and high-pressure resistance, and radiation resistance, which makes up for the shortcomings of the first-generation and second-generation semiconductor materials. Thus, the GaN-based semiconductor materials have a wide application prospect in the fields of power switching devices and microwave radio frequency. In addition, spontaneous polarization and piezoelectric polarization charges at interfaces of the GaN-based heterojunctions (represented by AlGaN/GaN) would induce the generation of high-density Two-Dimensional Electron Gas (2DEG) ($\sim 10^{13}$ cm$^{-2}$). Due to the limitation of transport dimension and no need for intentional material doping, the 2DEG channel has the significantly increased electron mobility ($\sim 2000$ cm$^2$V$^{-1}$s$^{-1}$). Due to this characteristic, the GaN-based heterostructures have obvious technical advantages in the development of high-performance High Electron Mobility Transistors (HEMTs), especially in the market of low- and medium-voltage chips below 1000 V.

GaN-based power devices have been studied for more than 20 years at home and abroad. At present, there are a small number of GaN-based device products below 200V in the market, which are mainly used in the fields of low-voltage radio frequency and consumer power conversion. However, the GaN technology in the range of 400~1000V is immature, and products thereof have not yet been tested by the market. There are two main reasons. On the one hand, further in-depth research is needed in the device back-end packaging, circuit matching, and reliability verification; on the other hand, the design and research of normally-off devices are still far from being popularized to the market. Power switching devices are classified into two types, i.e., normally-on devices and normally-off devices, according to whether a turn-on bias is required to be applied to a gate when the device is turned on. The normally-off power switching devices mean that the device is in an off state when no bias is applied to a gate. Compared with the normally-on devices, the normally-off devices have advantages of being safer and energy-saving, and simplifying circuit design in practical applications. Therefore, the normally-off power switching devices have the more important research value and broader application market. The present patent application aims at structural innovation and technical preparation of normally-off GaN-based power devices.

At present, there are many technologies used for realizing a normally-off operation of the HEMT power devices, mainly including three solutions, i.e., etching a gate barrier to form a recessed gate, implanting fluorine ions to form a fluorinated gate, and growing a p-type cap layer on a gate. The recessed gate solution is weakening or directly cutting off the 2DEG by partially or completely etching away an AlGaN barrier layer, thereby realizing a normally-off operation. This solution requires precise etching of the barrier layer. For large-area devices, it is difficult to control the uniformity of gate etching depth. The solution of implanting fluoride ions to a gate is using negatively charged fluoride ions to repel 2DEG to realize the purpose of a normally-off operation. However, in the process of application and promotion, it is difficult to ensure the thermal stability and performance reliability of the fluoride ion distribution in the devices. The gate p-type cap layer is a better technical solution. This technology retains a good 2DEG channel, and uses an additional built-in electric field therein to raise a conduction band at a 2DEG channel interface above the Fermi level, so as to obtain a normally-off operation. This technical solution may obtain a higher on-current density, and is suitable for industrialization promotion. The main problem at present is the low gate-withstand voltage and threshold voltage. Therefore, in view of this problem, how to innovate the device structure design and introduce a novel processing technology to increase the withstand voltage and threshold voltage of the device in the p-type cap layer solution is the technical problem that needs to be solved urgently in the industry.

SUMMARY

In order to solve the problems in the related art, the present invention provides a high-threshold-voltage normally-off high-electron-mobility transistor and a preparation method therefor. The transistor may realize a normally-off device type while maintaining a large on-current density. On this basis, the gate-withstand voltage and threshold voltage of the device are further improved.

The technical solution is as follows:

a high-threshold-voltage normally-off high-electron-mobility transistor includes: a substrate, a nucleation layer, an epitaxial layer, a barrier layer, a passivation layer, a gate cap layer, a composite gate dielectric insertion layer, a gate, a source, and a drain; the nucleation layer and the epitaxial layer being sequentially grown on the substrate; the barrier layer, the source, and the drain being located above the epitaxial layer; the barrier layer and the epitaxial layer forming a heterojunction structure, and a contact interface therebetween being induced by polarization charges to generate two-dimensional electron gas; the passivation layer being located above the barrier layer; the gate cap layer being located above the gate region barrier layer; the composite gate dielectric insertion layer being located above the gate cap layer; the gate being located above the composite gate dielectric insertion layer; the gate being in contact with the passivation layer; and a field plate extending from the gate to the drain on the passivation layer.

Further, the substrate is any one of silicon, sapphire, silicon carbide, diamond, and a GaN free-standing substrate; the nucleation layer is an AlN or AlGaN superlattice; the epitaxial layer is GaN or GaAs; the barrier layer is any one of AlGaN, InAlN, AlN, and AlGaAs; and the passivation layer is $SiO_2$, $Si_3N_4$, or a composite structure of the two.

Further, the gate cap layer is p-GaN or p-InGaN or p-AlGaN.

Further, the composite gate dielectric insertion layer is a single-layer structure formed of any material of gallium oxide, silicon dioxide, silicon nitride, aluminum oxide, and hafnium oxide, or a composite multiple structure composed of any combination of the above materials. The composite gate dielectric insertion layer may be used as an insulating barrier layer, or a dielectric layer that realizes the carrier tunneling effect. Moreover, the composite gate dielectric insertion layer may also be inserted under the gate cap layer. In this case, the composite gate dielectric may also be a high-resistance semiconductor.

The present invention further includes a preparation method of the high-threshold-voltage normally-off high-electron-mobility transistor, including the following steps:
S1: wafer growth;
S2: etching of an epitaxial layer structure;
S3: preparing of a source and a drain;
S4: preparing of a gate dielectric insertion layer; and
S5: preparing of a gate.

Further, step S1 is specifically as follows:
using a Metal Organic Chemical Vapor Deposition (MOCVD) or molecular beam epitaxy method to sequentially grow the nucleation layer, the epitaxial layer, the barrier layer, and the gate cap layer on a substrate;
or,
using an MOCVD device to sequentially form the nucleation layer, the epitaxial layer, the barrier layer, and the gate cap layer on a substrate.

Further, step S2 is specifically as follows:
using a semiconductor photolithography and etching method to prepare a device mesa, and etching a surface through the semiconductor etching method to achieve mesa isolation; repeating the step to etch away a barrier layer in source and drain regions to form a groove; and further, etching away a gate cap layer outside a gate region;
or,
spin coating a photoresist uniformly onto a sample; placing the sample onto a hot plate for heating and soft drying; placing the sample in an exposure machine for continuous exposure; developing the sample in a developing solution; heating a hard film on the hot plate; etching the epitaxial layer structure through a CL-based plasma ICP etching method to form mesa isolation, and then cleaning the sample and removing the photoresist with an acetone solution; repeating the step to etch away a barrier layer in source and drain regions to form a groove; and repeating the step to etch away a cap layer outside a gate region to form a gate cap layer.

Further, step S3 is specifically as follows:
defining regions required by a source and a drain through semiconductor photolithography, and depositing source and drain metals of the device through metal deposition, and transforming a composite metal structure into an alloy to form an ohmic contact through high-temperature annealing; and using any one of Plasma-Enhanced Chemical Vapor Deposition (PECVD), Low-Pressure Chemical Vapor Deposition (LPCVD), a magnetron sputtering method, and an electron beam evaporation method for deposition to form a passivation layer on the surface of the device;
or,
defining regions required by the source and the drain through semiconductor photolithography, depositing source and drain metals of the device through electron beam evaporation method, and then peeling and cleaning the sample and removing the photoresist in an acetone solution; transforming a composite metal structure into an alloy to form an ohmic contact through annealing in a nitrogen high temperature environment; and using a PECVD method to deposit to form the passivation layer on the surface of the device.

Further, step S4 is specifically as follows:
defining a gate region through semiconductor lithography, and performing surface oxidation on a gate cap layer to form a gate dielectric insertion layer; or, using any one of PECVD, LPCVD, MOCVD, Atomic Layer Deposition (ALD), and magnetron sputtering method to deposit to form a single-layer or composite multiple gate dielectric insertion layer;
or,
defining a gate region through semiconductor lithography, performing low-power oxygen ion pre-treatment on the surface of a gate cap layer, and then performing deposition using LPCVD to deposit to form a gate dielectric insertion layer.

Further, step S5 is specifically as follows:
defining the gate and the field plate region through semiconductor lithography, depositing a gate metal of the device and a field plate metal extending towards the drain through metal deposition method, and finally depositing a passivation layer on the surface of the device; and then using semiconductor photolithography to define open regions required by a source, a gate, and a drain, removing the passivation layer of the defined region to expose the metal electrode surface, and finally depositing a metal film to make leads, so that the electrode is completed, and the final device structure is obtained;
or,
defining the gate and the field plate regions through semiconductor lithography, depositing the gate and extending field plate metal through electron beam evaporation, and then peeling and cleaning the sample and removing the photoresist in an acetone solution; and depositing a passivation layer on the surface of the device through PECVD, using semiconductor photolithography to define open regions required by a source, a gate, and a drain, removing the passivation layer of the defined region to expose the metal electrode surface, and depositing an electrode metal through magnetron sputtering to obtain the final device structure.

The beneficial effects of the present invention are as follows:
the high-threshold-voltage normally-off high-electron-mobility transistor and the preparation method therefor in the present invention realize the normally-off device type while maintaining a large on-current density. The p-GaN (or p-InGaN or p-AlGaN) gate cap layer is subjected to surface oxidation to form a gate oxide dielectric layer, or a gate dielectric insertion layer is directly deposited or a multiple gate dielectric insertion layer is formed. The gate withstand voltage and the threshold voltage of the normally-off device are improved by increasing the conduction band position of the barrier layer.

DETAILED DESCRIPTION

A high-threshold-voltage normally-off high-electron-mobility transistor and a preparation method therefor are further described below with reference to FIG. 1 to FIG. 9.

Figure 1:
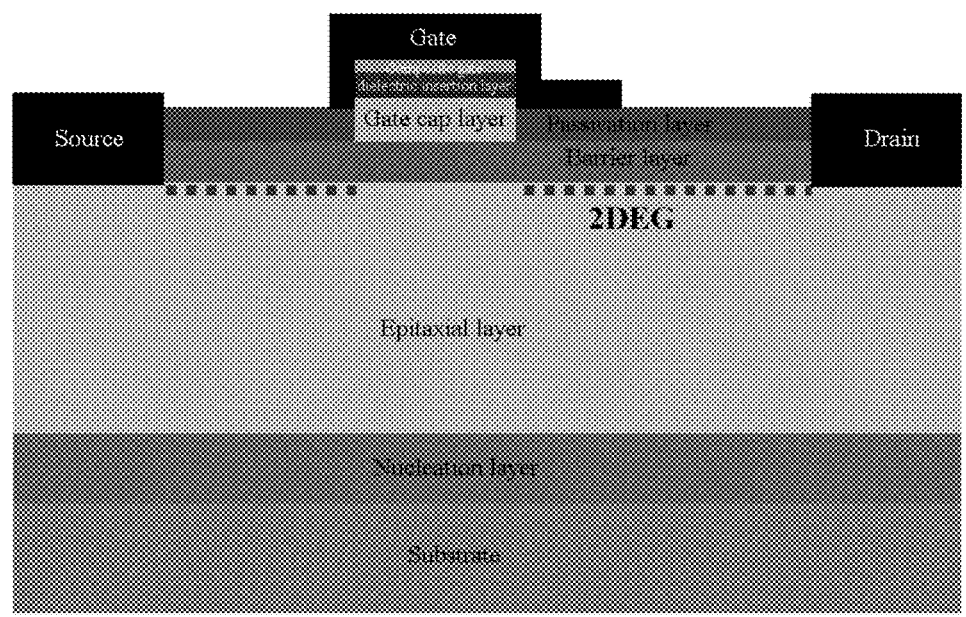
FIG. 1 is a schematic cross-sectional view of a high-threshold-voltage normally-off High Electron Mobility Transistor (HEMT) device according to the present invention.

According to the present patent application, for the solution of growing p-type cap layer on a gate, a p-GaN (or p-InGaN or p-AlGaN) gate cap layer is subjected to surface oxidation to form a gate oxide dielectric layer, or a gate dielectric insertion layer is directly deposited or a multiple gate dielectric insertion layer is formed. As shown in FIG. 1, the gate withstand voltage and the threshold voltage of the normally-off device are improved by increasing the conduction band position of the barrier layer. The gate p-type cap layer is a technical solution that can currently better realize normally-off devices in the industry. This technology does not damage the 2DEG channel, so the on-current density (or on-resistance) characteristic of the device is not decreased. Moreover, the additional built-in electric field formed on the p-GaN (or p-InGaN or p-AlGaN) gate cap layer raises the conduction band of the 2DEG channel interface above the Fermi level, so as to realize a normally-off operation. However, the threshold voltage is generally only about 1V, and the maximum withstand voltage of the gate is generally less than 10V. In the present patent application, after a single-layer or composite multiple gate dielectric insertion layer is introduced above the gate cap layer, the conduction band position at the interface of the barrier layer and the 2DEG channel is further elevated, and significantly increased gate withstand voltage (>20V) and threshold voltage (>2V) are obtained.

FIG. 1 is a schematic cross-sectional view of an HEMT device provided according to the present patent application, which is mainly characterized in that a gate dielectric insertion layer is introduced between the gate metal electrode and the p-type cap layer.

The basic structure of the device provided according to the present patent application is described as follows: a substrate is located at the bottom, and may be silicon, sapphire, silicon carbide, diamond or a GaN self-supporting substrate, etc.; an AN or AlGaN superlattice nucleation layer is located above the substrate; a GaN or GaAs epitaxial layer is located above the nucleation layer; an AlGaN, InAlN, AlN or AlGaAs barrier layer is located above the epitaxial layer; the barrier layer and the epitaxial layer form a heterojunction structure, and the interface is induced by polarized charges to generate two-dimensional electron gas (2DEG); silicon dioxide ($SiO_2$), silicon nitride ($Si_3N_4$) or a composite structure thereof is located above the barrier layer to form a passivation layer; a p-GaN or p-InGaN or p-AlGaN cap layer and a single-layer or composite multiple gate dielectric insertion layer formed of various materials such as gallium oxide ($Ga_2O_3$), $SiO_2$, $Si_3N_4$, aluminum oxide ($Al_2O_3$) or hafnium oxide ($HfO_2$) are located above the gate region barrier layer; a source and a drain are in contact with the epitaxial layer; a gate and a field plate extending towards the drain are located above the gate dielectric insertion layer.

The advantage of the device structure provided according to the present patent application is realizing the normally-off device type while maintaining a large on-current density. On this basis, the gate withstand voltage and the threshold voltage of the device can be further improved.

Embodiment 1

The specific implementation process of the present patent application is as follows:

Step 1: Wafer Growth.

Figure 2:
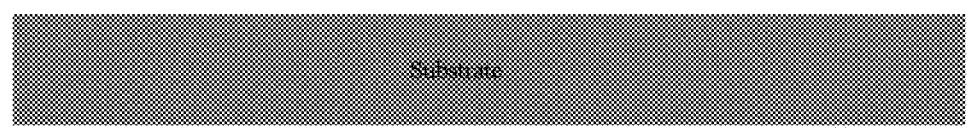
FIG. 2 is an example diagram a of preparation process flow of the device according to the present invention.
Figure 3:
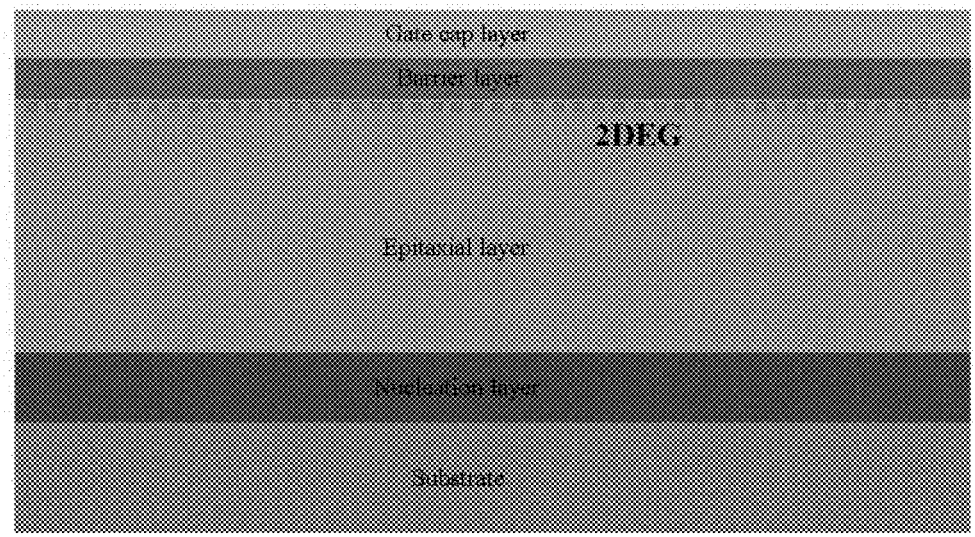
FIG. 3 is an example diagram b of preparation process flow of the device according to the present invention.

Semiconductor material growth techniques such as Metal Organic Chemical Vapor Deposition (MOCVD) or Molecular Beam Epitaxy (MBE) are used to sequentially grow an AlN or AlGaN superlattice nucleation layer, a 2~10 μm GaN or GaAs epitaxial layer, a 5~100 nm AlGaN, InAlN, AlN or AlGaAs barrier layer (wherein Al is 0.05~0.3), and a 30~100 nm p-GaN or p-InGaN or p-AlGaNgate cap layer on silicon, sapphire, silicon carbide, diamond or a GaN free-standing substrate, as shown in FIG. 2 and FIG. 3.

Step 2: the Epitaxial Layer Structure Etching.

Figure 4:
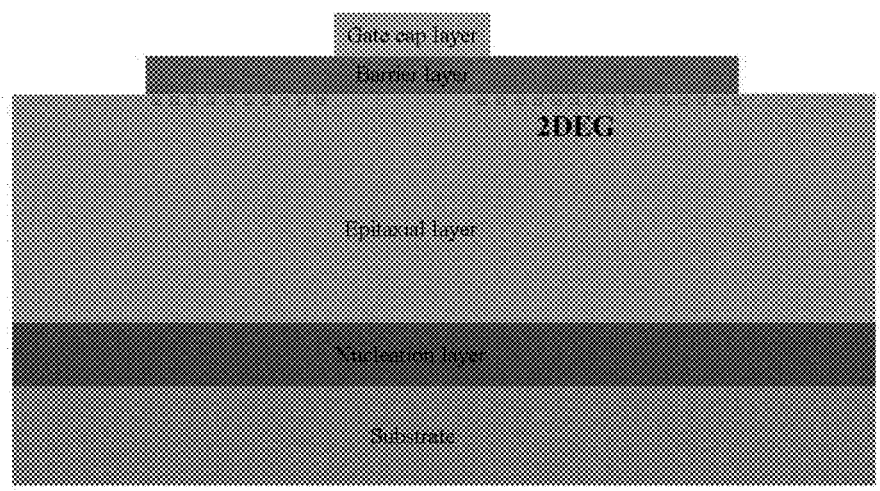
FIG. 4 is an example diagram c of preparation process flow of the device according to the present invention.

Semiconductor photolithography and etching technology are used to prepare a device mesa. The surface is etched by 300~800 nm through the semiconductor etching techniques such as Cl-based gas Inductively Coupled Plasma (ICP) or Reactive Ion Etching (RIE) to achieve mesa isolation. The step is repeated to etch away the barrier layer in the source and the drain regions to form a groove. The p-type cap layer outside the gate region is further etched away, as shown in FIG. 4. The semiconductor photolithography technology includes complete steps such as homogenization, soft baking, exposure, development, and film hardening.

Step 3: Preparation of the Source and the Drain.

Figure 5:
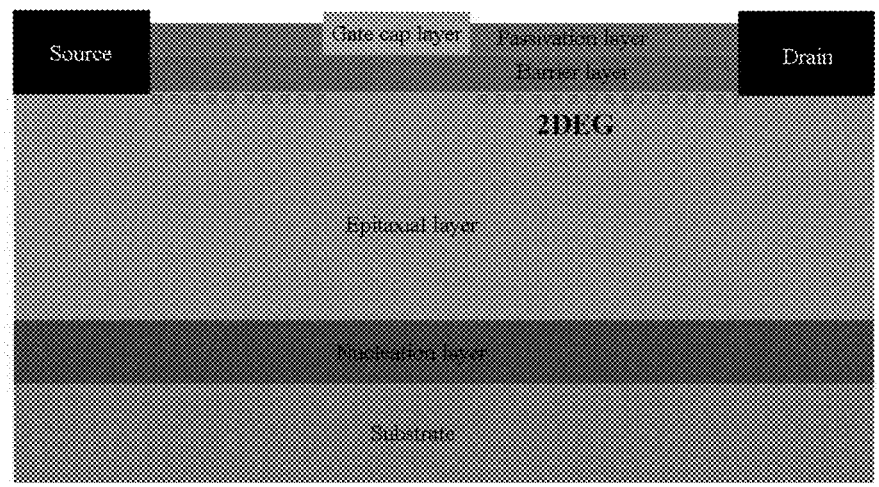
FIG. 5 is an example diagram d of preparation process flow of the device according to the present invention.

Regions required by the source and drain are defined through the semiconductor lithography technology described in step 2. Source and drain metals are deposited through metal deposition techniques such as magnetron sputtering and electron beam evaporation. The composite metal structure is transformed into an alloy to form an ohmic contact through high-temperature annealing. $SiO_2$, $Si_3N_4$ or a composite structure thereof are deposited through plasma enhanced chemical vapor deposition (PECVD), low pressure chemical vapor deposition (LPCVD), magnetron sputtering or electron beam evaporation to form a device surface passivation layer, as shown in FIG. 5.

Step 4: Preparation of the Gate Dielectric Insertion Layer.

Figure 6:
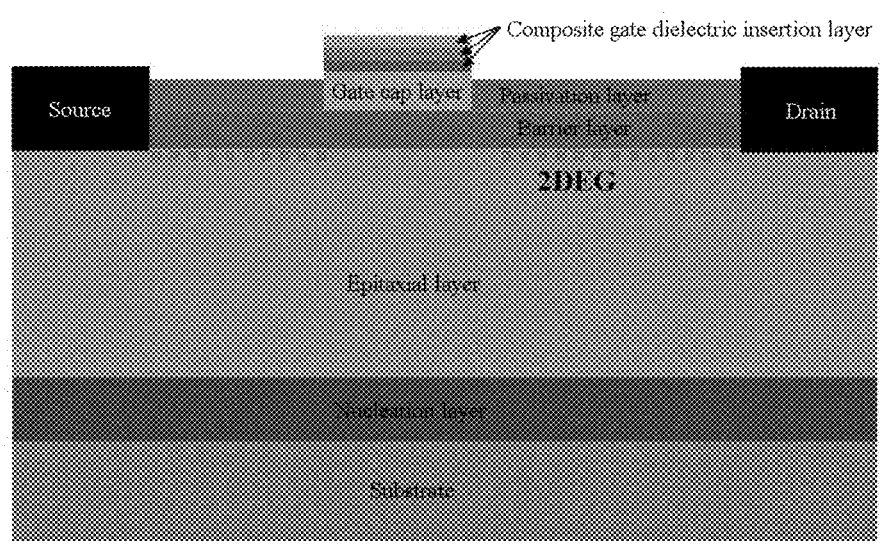
FIG. 6 is an example diagram e of preparation process flow of the device according to the present invention.

The gate region is defined through the semiconductor lithography technology described in step 2. The p-GaN (or p-InGaN or p-AlGaN) gate cap layer is subjected to surface oxidation to form a $Ga_2O_3$ dielectric layer. A single layer or composite multi-media insertion layer such as $SiO_2$, $Si_3N_4$, alumina ($Al_2O_3$) or hafnium oxide ($HfO_2$) is directly deposited through PECVD, LPCVD, MOCVD, ALD or magnetron sputtering, as shown in FIG. 6.

Step 5: Preparation of the Gate.

Figure 7:
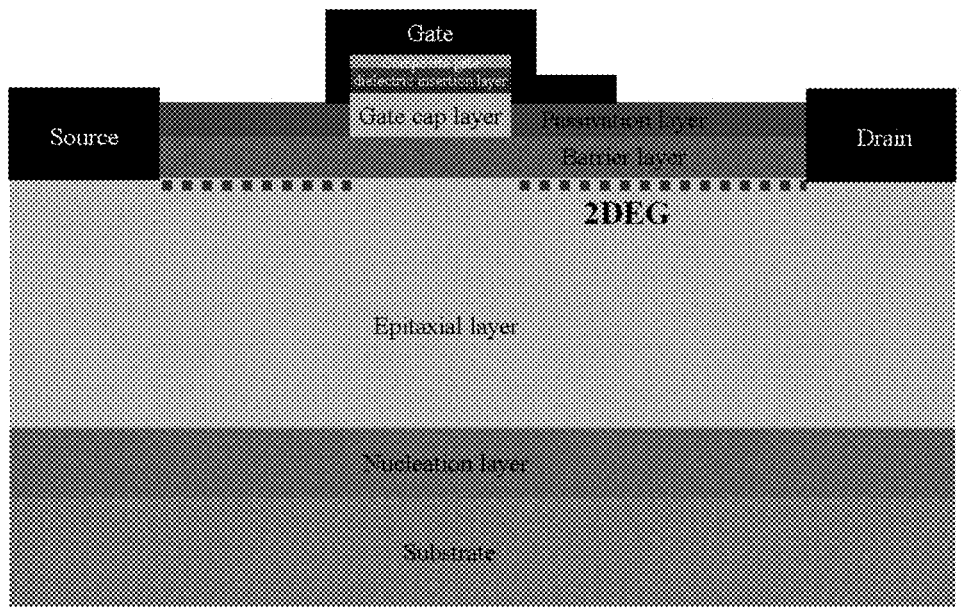
FIG. 7 is an example diagram f of preparation process flow of the device according to the present invention.

The gate and field plate regions are defined through the semiconductor lithography technology described in step 2. The gate metal and the field plate metal extending towards the drain of the device are deposited through the metal deposition technique described in step 3, as shown in FIG. 7. Finally, a passivation layer having a thickness of 300~5000 nm is deposited on the device surface. Then, open regions required by the source, the gate, and the drain are defined through the semiconductor lithography technology described in step 2. The passivation layer of the defined region is removed to expose the metal electrode surface. Finally, the metal film is deposited to make leads, so that the electrode is completed, and the final device structure is obtained.

Embodiment 2

The specific implementation process of the present patent application is as follows (detailed parameters and steps):

Step 1: GaN Structure Epitaxial Growth.

A 100 nm AlGaN super lattice nucleation layer, a 2 μm GaN epitaxial layer, a 20 nm AlGaN barrier layer (the Al component is 0.25), and a 50 nm p-GaN cap layer are sequentially grown on a 6-inch p-type Si substrate by using an MOCVD device. The structure and size of the device are designed as follows: the distance between the source and the gate of the device is 2 μm; the length and width of the gate are 3 μm and 200 μm; the length of the field plate extending from the gate to the drain is 1 μm; the distance between the gate and the drain is 10 μm; and each electrode area is 200×200 μm².

Step 2: Epitaxial Layer Structure Etching.

Semiconductor photolithography technology is used, and the specific process is as follows:
(1) an AZ5214 photoresist is spin coated uniformly onto a sample at a rate of 4000 r/min for 30 s;
(2) the sample is placed onto a hot plate at 100° C. for heating and soft drying for 90 s;
(3) the sample is placed in an exposure machine with a light intensity of 7 mW/cm² for continuous exposure for 20 s;
(4) the sample is developed for 45 s in a developing solution; and
(5) a hard film is heated on the hot plate at 105° C. for 60 s.

The epitaxial layer structure with a depth of 500 nm is etched through the Cl-based plasma ICP etching technology under a 150 W power supply power to form mesa isolation. Then, the sample is cleaned and the photoresist is removed with an acetone solution. This step is repeated, and a lower power supply power of 30 W is selected to etch away the 20 nm barrier layer in the source and drain regions to form a groove. This step is repeated, and a lower power supply power of 30 W is selected to etch away the p-GaN outside the gate region, thus forming a gate cap layer.

Step 3: Preparation of the Source and the Drain.

Regions required by the source and the drain are defined through the semiconductor lithography technology described in step 2. Source and drain metals of the device, i.e. Ti/Al/Ni/Au (20/100/45/55 nm), are deposited through electron beam evaporation technology. Then, the sample is peeled and cleaned and the photoresist is removed in the acetone solution. The composite metal structure is transformed into an alloy to form an ohmic contact through annealing in a nitrogen high temperature environment at 875° C. for 30 s. A 200 nm $SiO_2$ passivation layer is deposited by PECVD.

Step 4: Preparation of the Gate Dielectric Insertion Layer.

The gate region is defined through the semiconductor lithography technology described in step 2. Low-power (30 W) oxygen ion pre-treatment is performed on the surface of the p-GaN gate cap layer. Then, a $Si_3N_4$ gate dielectric insertion layer having a thickness of 5 nm is deposited through LPCVD.

Step 5: Preparation of the Gate.

The gate and field plate regions are defined through the semiconductor lithography technology described in step 2. The gate and extending field plate metals of the device, i.e. Ni/Au (100/100 nm), are deposited through electron beam evaporation. Then the sample is peeled and cleaned and the photoresist is removed in the acetone solution. Finally, a 1000 nm $SiO_2$ passivation layer is deposited on the device surface through PECVD. Then, open regions required by the source, the gate, and the drain are defined through the semiconductor lithography technology described in step 2. The passivation layer of the defined region is removed to expose the metal electrode surface. An Al metal having a thickness of 1500 nm is deposited through magnetron sputtering to obtain the final device structure.

Figure 8:
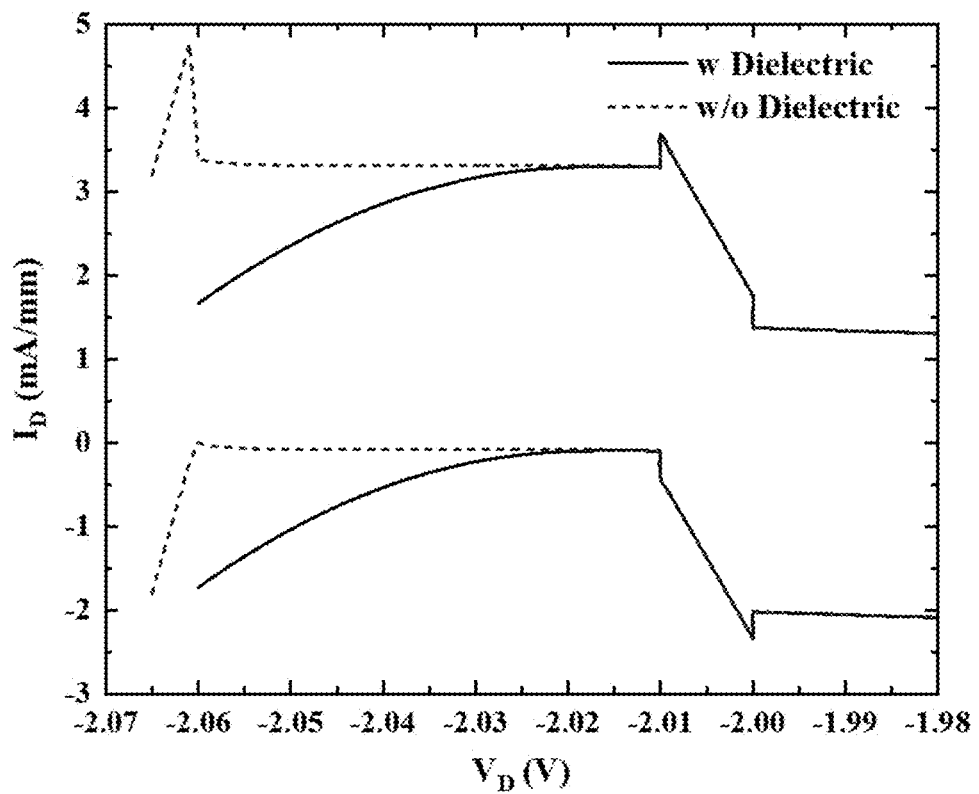
FIG. 8 is a schematic diagram of energy band comparison of devices in technical solutions with and without a composite gate dielectric insertion layer.
Figure 9:
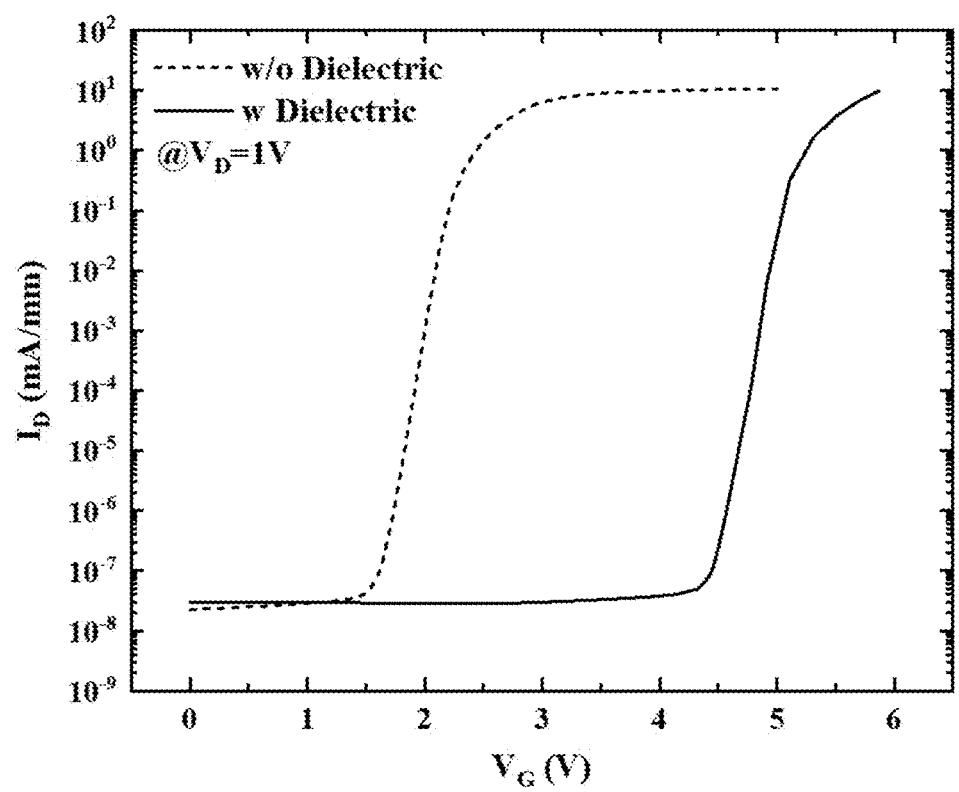
FIG. 9 is a schematic diagram of threshold voltage characteristics comparison of devices in technical solutions with and without a composite gate dielectric insertion layer.

FIG. 8 and FIG. 9 illustrate the comparison results of energy bands and threshold voltage characteristics of devices in technical solutions with and without a gate dielectric insertion layer obtained using the device structure parameters in the embodiments. It can be seen from the figures that the introduction of the gate dielectric insertion layer may significantly elevate the band order and conduction band position of the barrier layer, so as to increase the gate withstand voltage and threshold voltage of the normally-off device. The threshold voltage of the device is increased from 1.5 V to 4.5 V, while the good on-current level of the device is retained.

The foregoing are merely preferred specific implementation modes of the present invention, but the scope of protection of the present invention is not limited to this. Any equivalent variations or replacements to the technical solutions of the present invention and the inventive concepts thereof which are made by persons skilled in the art within the technical scope disclosed by the present invention shall be encompassed by the protection scope of the present invention. The embodiments described in the present invention do not limit the content of the present invention, and other heterojunction HEMT devices with 2DEG are applicable to the scope proposed by the present invention. Any other passivation layer growth (including different growth techniques and different passivation layer combinations or directly skipping passivation process steps), ohmic contact electrode preparation processes (including different metal selection, deposition methods, and annealing conditions) or mesa etching processes are applicable to the scope proposed by the present invention for the purpose of realizing the basic functions of the normally-off HEMT device in the present invention of performing plasma treatment on the surface of the p-type gate cap layer to form a dielectric layer or additionally introducing a single-layer or multiple composite dielectric insertion layer structure. The composite gate dielectric insertion layer may be an insulating barrier layer or a dielectric layer that realizes the carrier tunneling effect. Moreover, the composite gate dielectric insertion layer may also be inserted under the gate cap layer according to claim 1. In this case, the composite gate dielectric may also be a high-resistance semiconductor. Similarly, changes in material structure parameters and electrode dimensions or equivalent replacements should all be covered by the protection scope of the present invention.

The invention claimed is:

1. A high-threshold-voltage normally-off high-electron-mobility transistor, comprising:
    a substrate, a nucleation layer, an epitaxial layer, a barrier layer, a passivation layer, a gate cap layer, a composite gate dielectric insertion layer, a gate, a source, and a drain, wherein the nucleation layer and the epitaxial layer are sequentially grown on the substrate,
    the barrier layer, the source, and the drain are located above the epitaxial layer,
    the barrier layer and the epitaxial layer comprise a heterojunction structure, and a contact interface therebetween is induced by polarization charges to generate two-dimensional electron gas, the passivation layer is above the barrier layer,
    the gate cap layer is above a gate region of the barrier layer, the composite gate dielectric insertion layer is directly above the gate cap layer,
    the gate is located above the composite gate dielectric insertion layer, the gate is in contact with the passivation layer, and the gate covers and physically contacts (i) an entirety of a top surface and side walls of the composite gate dielectric insertion layer and (ii) a portion of side walls of the gate cap layer; and
    a field plate extends from the gate towards the drain on the passivation layer.

2. The high-threshold-voltage normally-off high-electron-mobility transistor according to claim 1, wherein the substrate is any one of silicon, sapphire, silicon carbide, diamond, and a GaN free-standing substrate, the nucleation layer is an AlN or AlGaN superlattice, the epitaxial layer is GaN or GaAs, the barrier layer is any one of AlGaN, InAlN, AlN, and AlGaAs, and the passivation layer is $SiO_2$, $Si_3N_4$, or a composite structure of the two.

3. The high-threshold-voltage normally-off high-electron-mobility transistor according to claim 1, wherein the gate cap layer is p-GaN or p-InGaN or p-AlGaN; and the composite gate dielectric insertion layer is a single-layer structure formed of any material of gallium oxide, silicon dioxide, silicon nitride, aluminum oxide, and hafnium oxide, or a composite multiple structure composed of any combination of the materials, or a high-resistance semiconductor.

4. The high-threshold-voltage normally-off high-electron-mobility transistor according to claim 1, wherein the composite gate dielectric insertion layer is insertable under the gate cap layer.

* * * * *